US008247790B2

(12) United States Patent
Kim (10) Patent No.: US 8,247,790 B2
(45) Date of Patent: Aug. 21, 2012

(54) WHITE LIGHT EMITTING DEVICE

(75) Inventor: Taek Kim, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 244 days.

(21) Appl. No.: 12/654,336

(22) Filed: Dec. 17, 2009

(65) Prior Publication Data
US 2010/0264400 A1 Oct. 21, 2010

(30) Foreign Application Priority Data
Apr. 16, 2009 (KR) .................. 10-2009-0033193

(51) Int. Cl.
*H01L 29/06* (2006.01)
(52) U.S. Cl. ..... 257/13; 257/94; 257/103; 257/E33.005; 257/E33.008
(58) Field of Classification Search .................. 257/13, 257/94, 103, E33.005, E33.008
See application file for complete search history.

(56) References Cited

U.S. PATENT DOCUMENTS

| 2002/0085603 A1* | 7/2002 | Okumura ............. 372/45 |
| 2005/0253152 A1* | 11/2005 | Klimov et al. ............ 257/79 |
| 2006/0145169 A1* | 7/2006 | Wang et al. ............ 257/89 |
| 2006/0270074 A1 | 11/2006 | Kim |
| 2008/0012031 A1 | 1/2008 | Jang et al. |
| 2008/0079022 A1 | 4/2008 | Yamamoto et al. |
| 2008/0173886 A1* | 7/2008 | Cheon et al. ............ 257/98 |
| 2008/0246017 A1 | 10/2008 | Gillies et al. |
| 2009/0109435 A1* | 4/2009 | Kahen et al. ............ 356/317 |
| 2010/0019261 A1* | 1/2010 | Scianna et al. ............ 257/98 |

FOREIGN PATENT DOCUMENTS

| JP | 2005-285800 | 10/2005 |
| JP | 2008-053608 | 3/2008 |
| KR | 10-2005-0081139 | 8/2005 |
| KR | 10-0723233 | 5/2007 |
| KR | 10-0741204 | 7/2007 |
| KR | 10-2007-0088006 | 8/2007 |
| KR | 10-2008-0055546 | 6/2008 |
| KR | 10-2008-0093556 | 10/2008 |
| WO | WO 2007/009010 | 1/2007 |

OTHER PUBLICATIONS

Shen Changyu, "CdSe/ZnS/CdS core/shell quantum dots for white LEDs", SPIE, PO Box 10 Bellingham WA 98227-0010 USA, vol. 7138, Nov. 18, 2008, pp. 71382E-1-71382E-5, XP040445204 DOI: 10.1117/12.818085.
Search Report dated Aug. 25, 2010 for corresponding European Patent Application No. EP 10 15 2314.

* cited by examiner

*Primary Examiner* — Tu-Tu Ho
(74) *Attorney, Agent, or Firm* — Harness, Dickey & Pierce, P.L.C

(57) ABSTRACT

A light emitting device (LED) may include a first semiconductor layer; an active layer formed on the first semiconductor layer and configured to generate first light having a first wavelength; a second semiconductor layer, formed on the active layer; and a plurality of semiconductor nano-structures arranged apart from each other and formed on the second semiconductor layer. The nano-structures may be configured to at least partially absorb the first light and emit second light having a second wavelength different from the first wavelength.

23 Claims, 5 Drawing Sheets

WHITE LIGHT EMITTING DEVICE

CROSS-REFERENCE TO RELATED APPLICATION(S)

This application claims priority to Korean Patent Application No. 10-2009-0033193, filed on Apr. 16, 2009, in the Korean Intellectual Property Office 0(KIPO), the entire contents of which are incorporated herein by reference.

BACKGROUND

1. Field

Example embodiments relate to light emitting device (LED) that may emit white light without using a phosphor.

2. Description of the Related Art

Light emitting devices (LEDs) using a semiconductor may be highly-efficient and environment-friendly light sources. They also may be used in various fields, such as display apparatuses, optical communication, automobiles, and normal lighting. In addition, the demands for white LEDs may be increasing.

White light may be emitted by using a phosphor. For example, white light may be obtained by exciting an ultraviolet (UV) LED to emit UV light and then by exciting red, green, and blue phosphors using the UV light to emit red, green, and blue lights, respectively. Thus, white light may be obtained. Alternatively, white light may be obtained using a blue LED as a light source and exciting a yellow phosphor to emit yellow light, because yellow is a complementary color of blue.

White light may be emitted without using a phosphor using a combination of LEDs that emit red, green, and blue lights.

SUMMARY

Example embodiments may provide light emitting device (LED) for emitting white light without using a phosphor.

According to example embodiments, A light emitting device (LED) may include a first semiconductor layer; an active layer formed on the first semiconductor layer and configured to generate first light having a first wavelength; a second semiconductor layer, formed on the active layer; and a plurality of semiconductor nano-structures arranged apart from each other and formed on the second semiconductor layer. The nano-structures may be configured to at least partially absorb the first light and emit second light having a second wavelength different from the first wavelength.

The LED may further include a transparent electrode layer covering the nano-structures.

A transparent electrode layer may be directly formed on the second semiconductor layer. The nano-structure array may be directly formed on the transparent electrode layer.

The width of the nano-structures may be less than the wavelength of light re-emitted by the nano-structure.

The active layer may have an InGaN-based multi-quantum well structure. The mole fraction of indium (In) of the active layer may be set such that the active layer emits blue light.

The first light and the second light may be blue light and yellow light, respectively.

The LED may further include nano-structures configured to at least partially absorb the first light and emit third light having third wavelength different from the second wavelength. The first light, second light and the third light may be blue light, red light and green light, respectively.

The nano-structures may be formed of InGaN, may have an InGaN-based multi-quantum well structure, and/or may have a core-shell structure including an InGaN-based multi-quantum well structure.

BRIEF DESCRIPTION OF THE DRAWINGS

The above and/or other aspects and advantages will become apparent and more readily appreciated from the following detailed description of example embodiments, taken in conjunction with the accompanying drawings, in which.

DETAILED DESCRIPTION

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an,"

and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 1:
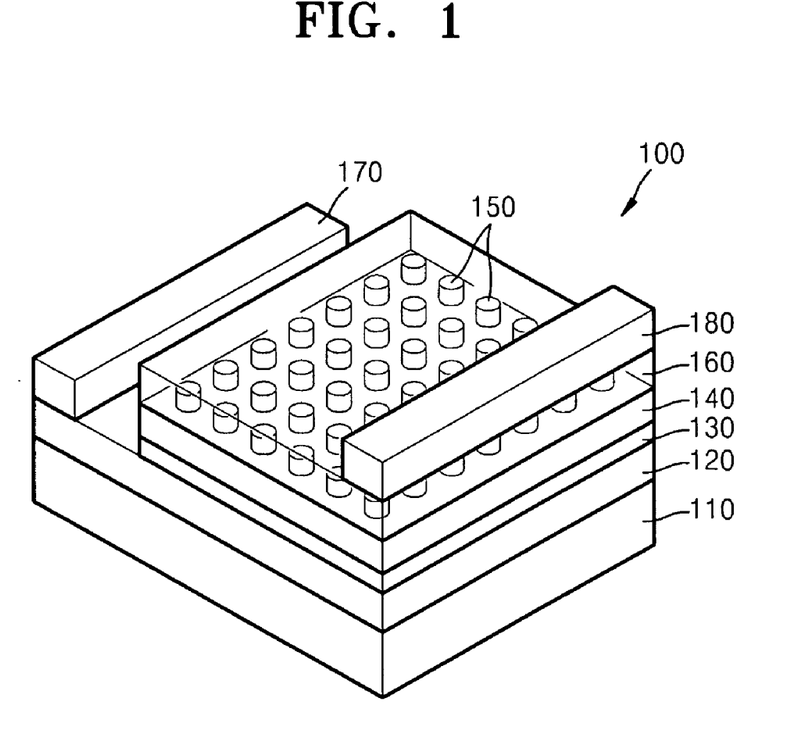
FIG. 1 is a diagram showing an exemplary configuration of a white light emitting device (LED)

FIG. 1 is a diagram showing an exemplary configuration of a light emitting device (LED), and FIGS. 2A through 2D are cross-sectional views showing exemplary nano-structures of the white LED of FIG. 1.

Referring to FIG. 1, the white LED 100 may include a nano-structure array including a plurality of nano-structures formed of semiconductor material(s) that may absorb incident light. The nano-structures may change the wavelength of incident light and/or may re-emit the incident light, having changed its wavelength. The nano-structures may be arranged apart from each other. For example, white LED 100 may include first semiconductor layer 120, active layer 130, and/or second semiconductor layer 140. First semiconductor layer 120 may be doped with first-type dopant. Active layer 130 may be formed on the first semiconductor layer 120. Second semiconductor layer 140 may be formed on the active layer 130. Second semiconductor layer 140 may be doped with second-type dopant. White LED 100 may include the nano-structure array, in which a plurality of nano-structures, which may be formed of semiconductor material(s) that absorb(s) and/or re-emit(s) light generated by active layer 130. The nano-structures may be formed apart from each other.

White LED 100 may include substrate 110, first semiconductor layer 120, active layer 130, second semiconductor layer 140, the nano-structure array, transparent electrode layer 160, first electrode 170, and/or second electrode 180. The nano-structure array may be formed on second semiconductor layer 140. Transparent electrode layer 160 may be formed to cover the overall nano-structure array. First electrode 170 may be formed on a portion of a top surface of first semiconductor layer 120. Second electrode 180 may be formed on a portion of a top surface of transparent electrode layer 160.

Substrate 110 may be, for example, a sapphire substrate, a SiC substrate, or a GaN substrate.

First semiconductor layer 120 may be a semiconductor layer doped with a first type dopant. First semiconductor layer 120 may be formed of a III-V family nitride semiconductor material (e.g., n-GaN). The first type dopant may be, for example, an n-type dopant. The first type dopant may include, for example, silicon (Si). Although not shown, a buffer layer for epitaxial growth may be formed on substrate 110.

Active layer 130 may be a layer that may emit light due to electron-hole recombination (e.g., an InGaN-based nitride semiconductor layer). A band of wavelengths of emitted light may be adjusted by controlling the band-gap energy in active layer 130. For example, active layer 130 may include a quantum well and/or a barrier layer. The quantum well may be formed, for example, of InGaN. The barrier layer may be formed, for example, of GaN, InGaN, AlGaN, and/or InAlGaN. Active layer 130 may include a single quantum well or a multi-quantum well. According to example embodiments, active layer 130 may be configured to emit, for example, blue light. In other words, the mole fraction of indium in an InGaN layer of active layer 130 may be set such that active layer 130 emits blue light. Generally, when the mole fraction of indium is changed by about 1%, the wavelength of emitted light is changed by approximately 5 nanometers (nm). For example, when emitting blue light, the mole fraction of indium in an InGaN layer is approximately 20%.

Second semiconductor layer 140 may be a semiconductor layer doped with a second type dopant. Second semiconductor layer 140 may be formed of a III-V family nitride semiconductor material (e.g., p-GaN). The second type dopant may be, for example, a p-type dopant. The second type dopant may include, for example, one or more of magnesium (Mg), calcium (Ca), zinc (Zn), cadmium (Cd), and mercury (Hg).

Various methods that may be generally known as methods for growth of III-V family compound semiconductors may be used for fabrications of first semiconductor layer 120, active layer 130, and/or second semiconductor layer 140. Examples of the methods may include metal organic chemical vapor deposition (MOCVD), hybrid vapor phase epitaxy (HVPE), molecular beam epitaxy (MBE), metal organic vapor phase epitaxy (MOVPE), and/or halide chemical vapor deposition (HCVD).

The nano-structure array may be prepared for pumping light, that is, absorbing and/or re-emitting light generated by active layer 130. The plurality of nano-structures 150 may be arranged apart from each other in the nano-structure array. Light emitted by LED 100 may become overall white by pumping light, that is, by partially absorbing light (e.g., blue light) emitted by active layer 130, changing the wavelength of the absorbed light (e.g., to yellow light), and/or re-emitting the absorbed light having the changed wavelength.

During the process, efficiency of changing the wavelength of light by pumping light may be important. The efficiency may be determined by the quality of the crystals of the nano-structures and/or light extracting efficiency. Nano-structures 150 may have structure in which InGaN-based semiconductor materials may have a fine width of several nanometers that may be grown to have shapes, such as nano-rods, nano-wires, and/or nano-dots, on second semiconductor layer 140. The shape of nano-structure 150 is not limited to the shape shown in FIG. 1. Nano-structure 150, having a shape such as that described above, may absorb stress by straining itself when a difference between the lattice constant of nano-structure 150 and the lattice constant of a GaN layer in second semiconductor layer 140 increases. Thus, considering a crystal flaw of a general InGaN thin-film (e.g., about $10^7/cm^2$), nano-structure 150 may be nearly a flawless crystal. Therefore, the content of indium may be freely adjusted and, thus, the range the wavelength of light may be changed may be freely set. Furthermore, when the size of nano-structure 150 is smaller than the wavelength of light emitted from nano-structure 150, most photons generated in the crystal of nano-structure 150 may be extracted out of the crystal, and thus very high light emitting efficiency may be expected. Nano-structure 150 may be formed to have a width smaller than the wavelength of light emitted by nano-structure 150, wherein the width may be, for example, greater than or equal to about 10 nm and less than or equal to about 500 nm.

If active layer 130 emits blue light, the nano-structure array may be configured, for example, to change incident blue light to yellow light. For example, each of the plurality of nano-structures 150 may be formed of a semiconductor material that changes blue light to yellow light. As described below, nano-structure 150 may employ an InGaN-based multi-quantum well structure, and in this case, the mole fractions of indium of a plurality of quantum well layers may be adjusted such that red light and/or green light may be respectively emitted from each of the quantum well layers. As a result, yellow light may be obtained.

Alternatively, the plurality of nano-structures 150 may include nano-structures for changing blue light to red light and/or nano-structures for changing blue light to green light. In this case, the nano-structures for changing blue light to red light and the nano-structures for changing blue light to green light may be, for example, alternately arranged in the nano-structure array.

First electrode 170 and/or second electrode 180 may be connected to an external power supply so that electrons and/or holes are injected to active layer 130. First electrode 170 and/or second electrode 180 may be formed, for example, of metals, such as gold (Au), aluminum (Al), and silver (Ag), or transparent conductive materials, such as indium tin oxide (ITO). According to an example embodiment, white LED 100 may have a mesa-shape structure in which active layer 130 may not completely cover first semiconductor 120, first semiconductor layer 120 may be partially exposed, and/or first electrode 170 may be formed on an exposed portion of first semiconductor layer 120. Second electrode 180 may be formed, for example, on a portion of the top surface of transparent electrode layer 160.

As shown in FIG. 1, transparent electrode layer 160 may completely cover the nano-structure array. In other words, since nano-structure 150 functions as a path in which applied current may flow, nano-structure 150 may be doped with the same dopant as second semiconductor layer 140 (e.g., the second type dopant), which may be a p-type dopant. In this structure, nano-structure 150 and transparent electrode layer 160 may contact each other over a large area so that current may be easily applied to active layer 130. Furthermore, operating voltage of white LED 100 may be lowered, and thus electrical characteristics may be enhanced (e.g., reduction of heat generation).

Referring to FIGS. 2A through 2E, example embodiments of nano-structure 150 will be described below.

Figure 2A:
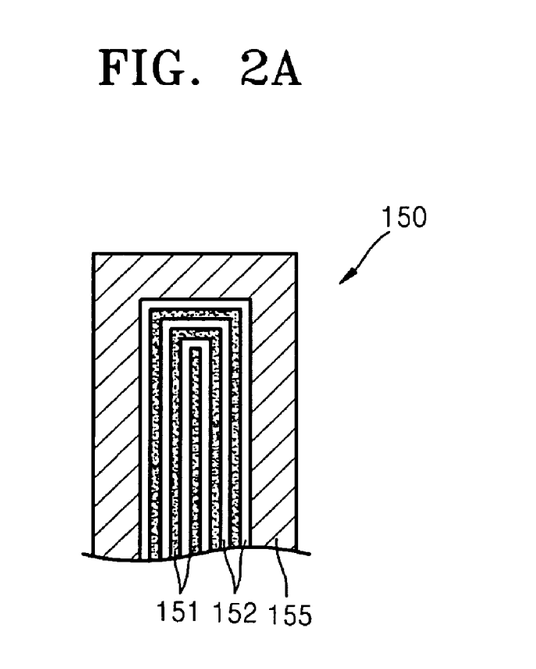
FIGS. 2A through 2E are cross-sectional views showing exemplary nano-structures of the white LED of FIG. 1.

Nano-structure 150 of FIG. 1, as shown in FIG. 2A, may have a core-shell structure. The core may have an InGaN-based multi-quantum well structure, in which, as shown in FIG. 2A, quantum well layers 151 and barrier layers 152 may be alternately stacked radially. The quantum well layers 151 may be formed of $In_xGaAl_yN$ ($0 < x \leq 1$, $0 \leq y \leq 1$). The barrier layers 152 may be formed of $In_vGaAl_wN$ ($0 \leq v < 1$, $0 \leq w \leq 1$). Shell 155 may be formed of GaN, covering quantum well layers 151 and/or barrier layers 152.

Figure 2B:
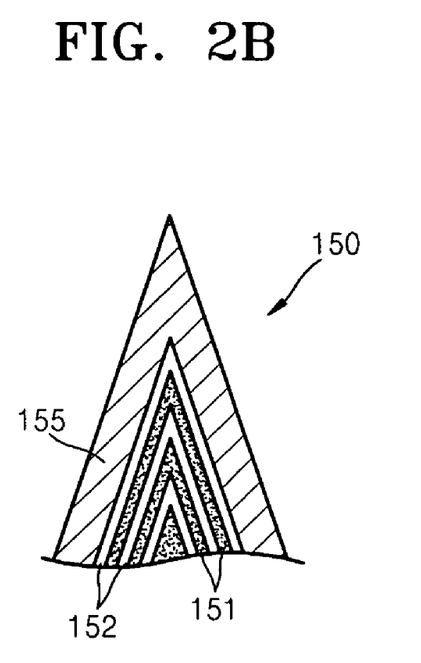

Nano-structure 150 of FIG. 1, as shown in FIG. 2B, may also have a core-shell structure but have a different cross-sectional shape than the nano-structure 150 of FIG. 2A. The nano-structure 150 of FIG. 2B is polygonal pyramid type and shows triangular cross-sectional shape. The core may have an InGaN-based multi-quantum well structure, in which, as shown in FIG. 2B, quantum well layers 151 and barrier layers 152 may be alternately stacked radially. The quantum well layers 151 may be formed of $In_xGaAl_yN$ ($0 < x \leq 1$, $0 \leq y \leq 1$). The barrier layers 152 may be formed of $In_vGaAl_wN$ ($0 \leq v < 1$, $0 \leq w \leq 1$). Shell 155 may be formed of GaN, covering quantum well layers 151 and/or barrier layers 152.

Figure 2C:
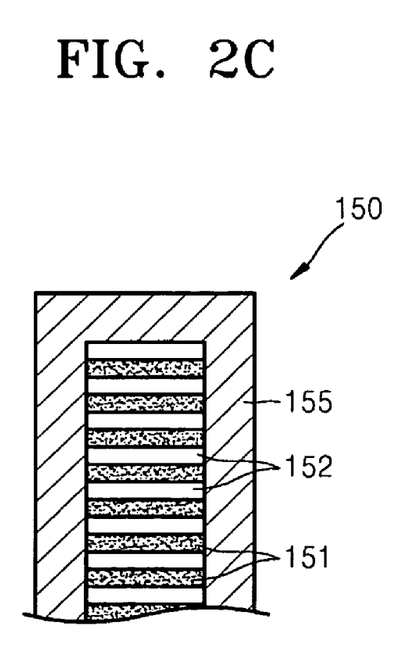

Nano-structure 150 of FIG. 1, as shown in FIG. 2C, may have a core-shell structure, which may be similar to the core-shell structure shown in FIG. 2A. However, the core may have an InGaN-based multi-quantum well structure in which quantum well layers 151 and barrier layers 152 may be alternately stacked in a vertical direction. The quantum well layers 151 may be formed of $In_xGaAl_yN$ ($0 < x \leq 1$, $0 \leq y \leq 1$). The barrier layers 152 may be formed of $In_vGaAl_wN$ ($0 \leq v < 1$, $0 \leq w \leq 1$). Shell 155 may be formed of GaN.

Since the core-shell structures as shown in FIGS. 2A, 2B and 2C may employ GaN semiconductor materials, which have relatively higher band-gap energy, as shells 155, carrier confinement may reduce surface recombination loss. Thus, high light re-emitting efficiency may be expected.

Figure 2D:
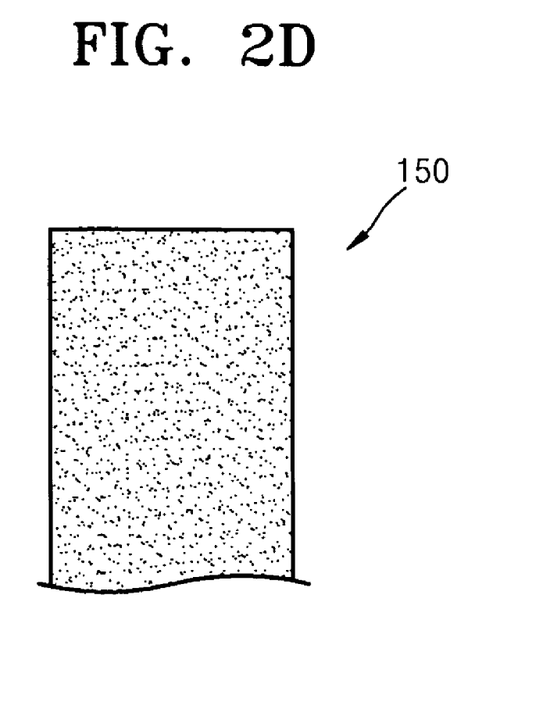
Figure 2E:
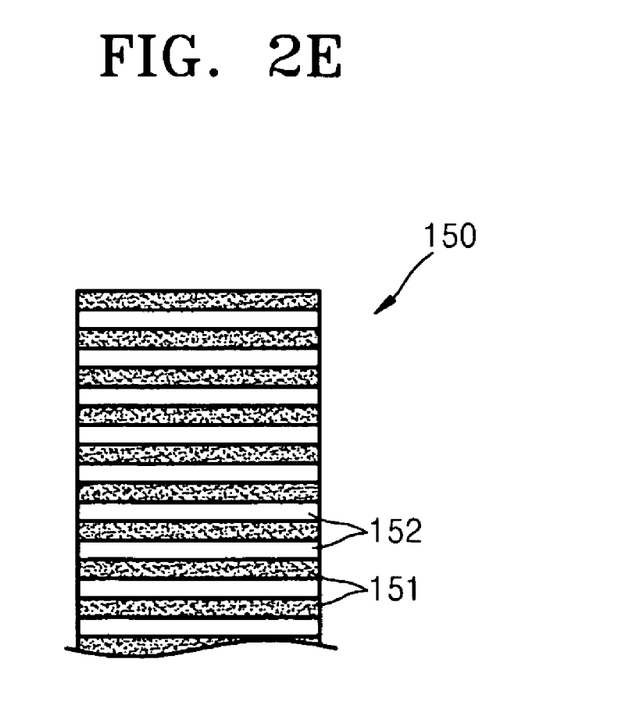

Nano-structure 150 of FIG. 2D may have an InGaN-based structure. Nano-structure 150 of FIG. 2E may have an InGaN-based multi-quantum well structure in which quantum well layers 151 and barrier layers 152 may be alternately stacked. The structures as shown in FIGS. 2D and 2E may be formed of an InGaN semiconductor material that may have relatively lower band-gap energy as compared to GaN semiconductor material. Thus, contact resistance may be further reduced when current is applied.

An InGaN material employed by the nano-structures shown in FIGS. 2A through 2E may change the wavelength of incident light according to its indium content. When active layer 130 emits blue light, nano-structure 150 may have an indium content for emitting green light and/or an indium content for emitting red light so as to embody white light. In this regard, when the nano-structure array is being configured, nano-structures for emitting green light and nano-structures emitting red light may be alternately arranged. In addition or in the alternative, nano-structure 150 may have a structure in which mole fractions of a plurality of quantum well layers 151, which constitute nano-structures 150, may be adjusted such that the plurality of quantum well layers 151 emit red light and/or green light.

Nano-structure 150, as shown in FIGS. 2A through 2E, may be grown, for example, using a general method of growing a nano-wire. For example, nano-structure 150 may be grown via a vapor-liquid-solid (VLS) process by using a metal catalyst, such as Fe, Ni, and/or Au. In addition or in the alternative, after forming a template layer (not shown) and/or forming a groove in the template layer, nano-structure 150 may be grown within the groove. Furthermore, nano-structure 150 may be grown using methods such as MOCVD, HVPE, MBE, MOVPE, and/or HCVD.

In white LED 100 having nano-structures 150 as described above, blue light generated by active layer 130 may be partially absorbed by nano-structure 150. The wavelength of the absorbed blue light may be changed such that the absorbed blue light is re-emitted as yellow light and/or red light and green light. Meanwhile, remaining parts of the blue light generated by active layer 130 may be emitted outside as blue light. Thus, white light may be obtained. With respect to the emission of blue light generated by active layer 130, nano-structure 150 may provide periodically changing refractive index to reduce total reflection. Thus, generated light may be emitted with high light extracting efficiency. Furthermore, when light absorbed by nano-structure 150 is re-emitted as light having changed wavelength, since nano-structure 150 may have few crystal flaws and a size that may be smaller than the wavelength, light emitting efficiency of white LED 100 may be very high.

Figure 3:
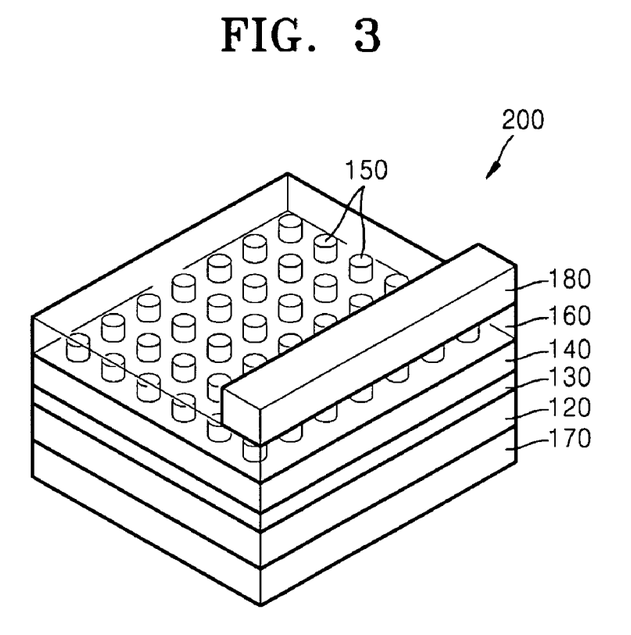
FIG. 3 is a diagram showing another exemplary configuration of a white LED.

FIG. 3 is a diagram showing another exemplary configuration of white LED. The example embodiment shown in FIG. 3 may employ a vertically-stacked structure, in which the arrangement of first electrode 170 may be different from that of other example embodiments. First electrode 170 may be formed on a rear surface of first semiconductor layer 120. In the case of white LED 100 of FIG. 1, after first semiconductor layer 120, active layer 130, and/or second semiconductor layer 140 may be completely grown, second semiconductor layer 140 and/or active layer 130 may be partially etched to partially expose first semiconductor layer 120, and first electrode 170 may be formed on the exposed portion of first semiconductor layer 120. In contrast, in FIG. 3, after first semiconductor layer 120, active layer 130, and/or second semiconductor layer 140 may be completely grown, the substrate (110 of FIG. 1) may be removed, and first electrode 170 may be formed on the rear surface of first semiconductor layer 120.

Figure 4:
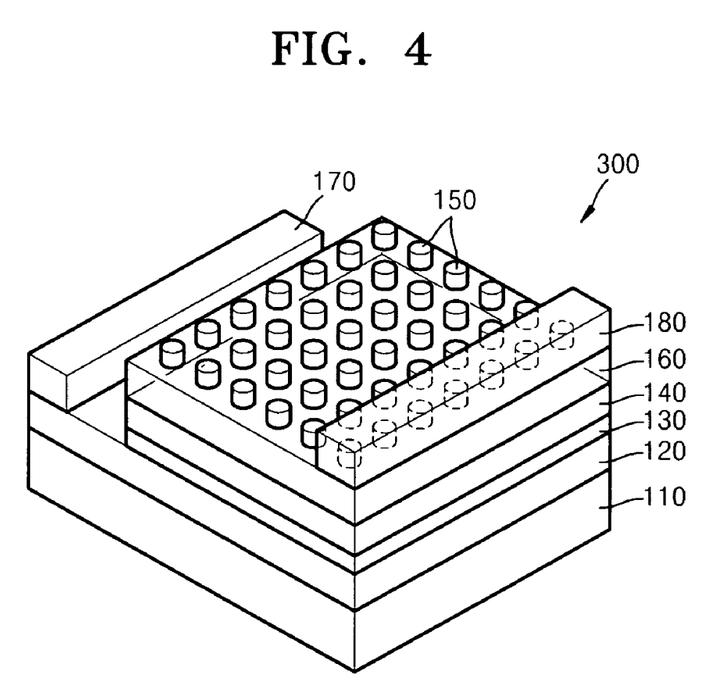
FIG. 4 is a diagram showing another exemplary configuration of a white LED.

FIG. 4 is a diagram showing another exemplary configuration of white LED. According to the example embodiment shown in FIG. 4, the location of nano-structure 150 in white LED 300 may be different from the location of nano-structure 150 in white LED 100 of FIG. 1. According to the embodiment, substrate 110, first semiconductor layer 120, active layer 130, second semiconductor layer 140, and/or transparent electrode layer 160 may be sequentially formed. Nano-structures 150, each of which may be formed of a semiconductor material for absorbing and/or re-emitting light generated by active layer 130, may be formed apart from each other. The nano-structure array, comprising the nano-structures 150, may be formed on transparent electrode layer 160. First electrode 170 and/or second electrode 180, for applying current to active layer 130, may be formed on the exposed portion of first semiconductor layer 120 and a portion of the top surface of transparent electrode layer 160, respectively. In the structure, nano-structure 150 may not be used as a path in which applied current flows, and thus it may not be necessary to dope nano-structure 150. In other words, nano-structure 150 may be formed of an undoped semiconductor material. Although FIG. 4 shows that second electrode 180 may partially cover nano-structure 150, it is merely an example, and white LED 300 may be alternatively configured such that nano-structure 150 may not be formed on a portion of the top surface of transparent electrode layer 160 that contacts second electrode 180.

Figure 5:
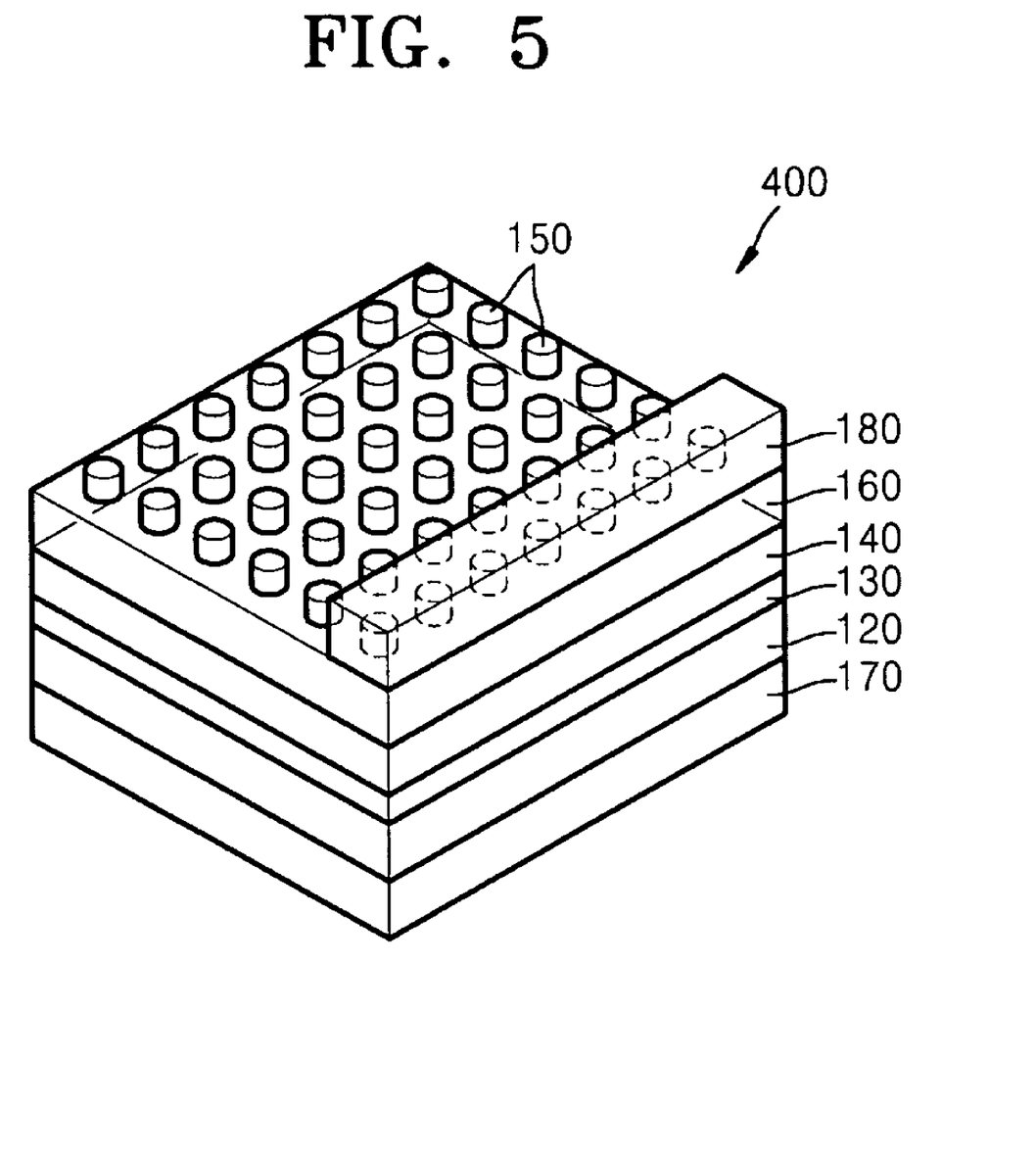
FIG. 5 is a diagram showing another exemplary configuration of a white LED.

FIG. 5 is a diagram showing another exemplary configuration of white LED. Compared to the example embodiment of FIG. 4, the example embodiment of FIG. 5 may employ a vertical structure. In other words, first electrode 170 may be formed on the rear surface of first semiconductor layer 120.

Nano-structures 150 employed by white LEDs 200, 300, and 400, shown in FIGS. 3 through 5, may have, for example, the structures shown in FIGS. 2A through 2D. In example embodiments, the wavelength of a part of light generated by active layer 130 may be changed by nano-structures 150, while the remaining part of the light generated by active layer 130 may be emitted as-is. As a result, white light may be emitted.

Since a white LED according to example embodiments may embody white light without using a phosphor, the white LED according to example embodiments may be fabricated in a simple fabrication processes. Also, fabrication cost of the white LED may be reduced.

A white LED according to example embodiments may employ a semiconductor nano-structure for emitting white light. For example, a nano-structure employed in example embodiments may have few crystal flaws, and thus high internal quantum efficiency may be achieved. When light generated by an active layer is emitted outside, periodically changing refractive index of the nano-structure may improve an efficiency of extracting the light generated by the active layer to the outside.

Furthermore, the nano-structure may contact transparent electrode layer 160 over a large area. In this case, current may be easily applied to active layer 130, so that electrical characteristics may be enhanced (e.g. reduction of heat generation, improved reliability).

While example embodiments have been particularly shown and described, it will be understood by those of ordinary skill in the art that various changes in form and details may be made therein without departing from the spirit and scope of the present invention as defined by the following claims.

What is claimed is:

1. A light emitting device (LED), comprising:
a first semiconductor layer;
an active layer formed on the first semiconductor layer and configured to generate first light having a first wavelength;
a second semiconductor layer formed on the active layer;
a plurality of first semiconductor nano-structures arranged apart from each other and formed on the second semiconductor layer, the plurality of first semiconductor nano-structures being configured to at least partially absorb the first light and emit second light having a second wavelength different from the first wavelength; and
a transparent electrode layer formed on the second semiconductor layer, the transparent electrode layer directly contacting the plurality of first semiconductor nano-structures,
wherein the plurality of first semiconductor nano-structures have an InGaN-based multi-quantum well structure.

2. The LED of claim 1, wherein the first light generated by the active layer and the second light emitted by the plurality of first semiconductor nano-structures in combination produce white light.

3. The LED of claim 1, wherein the transparent electrode layer covers the plurality of first semiconductor nano-structures.

4. The LED of claim 1, wherein the plurality of first semiconductor nano-structures are formed directly on the second semiconductor layer.

5. The LED of claim 4, wherein the plurality of first semiconductor nano-structures are doped.

6. The LED of claim 1, wherein the transparent electrode layer is formed directly on the second semiconductor layer, and the plurality of first semiconductor nano-structures are formed directly on the transparent electrode layer.

7. The LED of claim 6, wherein the plurality of first semiconductor nano-structures are undoped.

8. The LED of claim 1, wherein the plurality of first semiconductor nano-structures are arranged in an array.

9. The LED of claim 1, wherein a width of each nano-structure of the plurality of first semiconductor nano-structures is less than the second wavelength.

10. The LED of claim 1, wherein a width of each nano-structure of the plurality of first semiconductor nano-structures is greater than or equal to about 10 nm and less than or equal to about 500 nm.

11. The LED of claim 1, wherein the active layer has an InGaN-based multi-quantum well structure.

12. The LED of claim 11, wherein a mole fraction of indium of the active layer is set such that the active layer emits blue light.

13. The LED of claim 1, wherein the first light and the second light are blue light and yellow light, respectively.

14. The LED of claim 1, wherein the plurality of first semiconductor nano-structures emit yellow light.

15. The LED of claim 1, further comprising:
a plurality of second semiconductor nano-structures configured to at least partially absorb the first light and emit third light having a third wavelength different from the second wavelength.

16. The LED of claim 15, wherein the first light, the second light and the third light are blue light, red light and green light, respectively.

17. The LED of claim 1, wherein the plurality of first semiconductor nano-structures are formed of InGaN.

18. The LED of claim 1, wherein the plurality of first semiconductor nano-structures have a core-shell structure including a core and a shell.

19. The LED of claim 18, wherein
the core comprises the InGaN-based multi-quantum well structure formed of $In_xGaAl_yN$ ($0 \leq x \leq 1$, $0 \leq y \leq 1$), and the shell is formed of GaN.

20. The LED of claim 19, wherein the multi-quantum well structure has a radially-stacked structure.

21. The LED of claim 19, wherein the multi-quantum well structure has a vertically-stacked structure.

22. The LED of claim 1, wherein the first semiconductor layer is doped with silicon.

23. The LED of claim 1, wherein the second semiconductor layer is doped with one or more of magnesium, calcium, zinc, cadmium, and mercury.

* * * * *